US006207489B1

United States Patent
Nam et al.

(10) Patent No.: US 6,207,489 B1
(45) Date of Patent: Mar. 27, 2001

(54) METHOD FOR MANUFACTURING CAPACITOR OF SEMICONDUCTOR MEMORY DEVICE HAVING TANTALUM OXIDE FILM

(75) Inventors: Kab-jin Nam, Yongin; Seok-jun Won, Seoul; Ki-yeon Park, Yongin; Yong-woo Hyung, Suwon; Young-wook Park, Anyang, all of (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/393,186

(22) Filed: Sep. 10, 1999

(30) Foreign Application Priority Data

Jan. 5, 1999 (KR) .......................................... 99-55

(51) Int. Cl.[7] ............................................. H01L 21/8242
(52) U.S. Cl. .......................... 438/240; 438/250; 438/253; 438/393; 438/396
(58) Field of Search ................................... 438/240, 250, 438/393, 785, 253, 396

(56) References Cited

U.S. PATENT DOCUMENTS 5,438,012   8/1995   Kamiyama .
5,468,687 * 11/1995   Carl et al. .
5,688,724 * 11/1997   Yoon et al. .
5,837,593 * 11/1998   Park et al. .
5,985,730 * 11/1999   Lim .

OTHER PUBLICATIONS

H. Shinriki and M. Nakata, "UV–O and Dry–O: Two–Step Annealed Chemical Vapor–Deposited Ta O Films for Storage Dielectrics of 64–MbDRAM's," IEEE Transactions on Electron Devices, vol. 38, No. 3, Mar. 1991, pp. 455–462.*

* cited by examiner

Primary Examiner—Charles Bowers
Assistant Examiner—Stephen W. Smoot
(74) Attorney, Agent, or Firm—Jones Volentine, LLC

(57) ABSTRACT

A method for manufacturing a capacitor having a dielectric film formed of a tantalum oxide film. The method includes forming a lower electrode that is electrically connected to an active region of a semiconductor substrate. A pre-treatment film including a component selected from a group consisting of silicon oxide, silicon nitride, and combinations thereof, is formed on the surface of the lower electrode. A dielectric film is formed on the pre-treatment film using a Ta precursor. The dielectric film includes a first dielectric layer deposited at a first temperature selected from a designated temperature range, and a second dielectric layer deposited at a second temperature different from the first temperature and selected from the same designated temperature range. A thermal treatment is thereafter performed on the dielectric film in an oxygen atmosphere.

21 Claims, 5 Drawing Sheets

METHOD FOR MANUFACTURING CAPACITOR OF SEMICONDUCTOR MEMORY DEVICE HAVING TANTALUM OXIDE FILM

BACKGROUND OF THE INVENTION

1. Field of the Invention

The present invention relates to a method for manufacturing a semiconductor memory device, and more particularly, to a method for manufacturing a capacitor having a dielectric film formed of a tantalum oxide film.

2. Description of the Related Art

As the integration degree of a dynamic random access memory (DRAM) increases, methods of increasing the effective area of a capacitor, methods of reducing the thickness of a dielectric film, and methods of increasing the dielectric constant of the dielectric film are used in order to increase the amount of charge accumulated in a restricted cell area.

For example, in a stacked structure comprising a silicon nitride film and a silicon oxide film used as the dielectric film of current highly integrated memory devices, the effective electrical thickness is reduced by physically reducing the thickness of the stacked structure. The limits of the effective electrical thickness of the stacked structure comprising the silicon nitride film and the silicon oxide film are considered to be about 40 Å. A dielectric film having an effective electrical thickness of less than 40A is difficult to deploy in an operating device due to the large leakage current experienced at such thicknesses.

In order to overcome the limits of the stacked silicon nitride and silicon oxide films, dielectric materials with higher dielectric constants are being employed. For example, a tantalum oxide film has a dielectric constant of about 24, which is larger than the dielectric constant of a silicon nitride film, which is about 7. Moreover, ferroelectric materials with dielectric constants of no less than several hundreds are being employed.

The appropriateness of introducing a new dielectric material should be determined based on its suitability for use in conventional processes, probability of stable manufacturing apparatuses, mass productivity, economical efficiency, and stableness of the operation of the device. The tantalum oxide film is known to be the material which most closely satisfies the above requirements.

The electrical characteristics of the tantalum oxide film depend considerably on the processing conditions. In the present invention, optimal processing conditions are described for forming the tantalum oxide film for use as a dielectric film.

SUMMARY OF THE INVENTION

It is an object of the present invention to provide a method for manufacturing a capacitor of a semiconductor memory device in which a tantalum oxide film is formed under optimal processing conditions to thereby achieve optimal electrical characteristics for the tantalum oxide film when Io used as a dielectric film of the capacitor.

Accordingly, to achieve the above and other objects, the present invention provides a method for manufacturing a capacitor of a semiconductor memory device where a lower electrode is formed that is electrically connected to an active region of a semiconductor substrate. A pre-treatment film, including a component selected from a group consisting of silicon oxide, silicon nitride, and combinations thereof, is formed on the surface of the lower electrode. A dielectric film is formed on the pre-treatment film using a tantalum (Ta) precursor, with the dielectric film comprising a first dielectric layer deposited at a first temperature selected from a designated temperature range, and a second dielectric layer deposited at a second temperature different from the first temperature and selected from the same designated temperature range. A thermal treatment is thereafter performed on the dielectric film in an oxygen atmosphere.

The lower electrode is formed of one selected from a group consisting of a polysilicon film, a metal film, a metal oxide film, a metal nitride film, a metal oxynitride film and combinations thereof.

The Ta precursor is one selected from a group consisting of metal alkoxides, organic metals, metal halides, and mixtures thereof.

The pre-treatment film is formed by a rapid thermal nitridation (RTN) method, a rapid thermal oxidation (RTO) method, a chemical vapor deposition (CVD) method, or a combination thereof. The step of forming the pre-treatment film may comprise a step of supplying plasma or irradiating ultra violet (UV) radiation.

During the step of forming the dielectric film, the designated temperature range is 350 to 550° C. The second temperature may be lower than or higher than the first temperature. The dielectric film forming step is performed at a pressure of between 100 mTorr and atmospheric pressure. The forming of the dielectric film can be carried out in a single wafer type reactor or a batch type reactor, and may comprise a step of supplying plasma or irradiating ultra violet (UV) radiation.

The thermal treatment is performed at 650 to 800° C. The thermal treatment is performed in a gas atmosphere selected from a group consisting of $O_2$, $O_3$, or $N_2O$, and mixtures thereof. The thermal treatment step may comprise a step of supplying plasma or irradiating ultra violet (UV) radiation.

After forming the pre-treatment film and before forming the dielectric film, the method may further comprise flowing the Ta precursor over the lower electrode covered with the pre-treatment film.

According to the present invention, it is possible to form a tantalum oxide film having a reduced defect density. When such a tantalum oxide film is used as a dielectric film, it is possible to improve the electrical characteristics of a capacitor. Productivity is raised by reducing the incubation time during a deposition process for forming the tantalum oxide film.

BRIEF DESCRIPTION OF THE DRAWINGS

The above objects and advantages of the present invention will become more apparent by describing in detail a preferred embodiment thereof with reference to the attached drawings in which.

DESCRIPTION OF THE PREFERRED EMBODIMENTS

In general, a manufacturing process for a capacitor using a tantalum oxide film as a dielectric film includes the steps of forming a lower electrode, performing a pre-treatment for suppressing a reaction or diffusion between the lower electrode and the tantalum oxide film, depositing the tantalum oxide film, performing thermal processing for densifying the film by supplying oxygen which is lacking in the deposited tantalum oxide film.

The electrical characteristics of a capacitor manufactured by the above method are affected by numerous factors including the above described pre-treatment conditions, deposition conditions of the tantalum oxide film, thermal processing conditions, and conditions following thermal processing which are performed after forming an upper electrode.

A deposition temperature, a deposition pressure, flow rates of a source gas and a carrier gas, and a temperature of a gas supplying line are factors which affect the electrical characteristics during the process of depositing the tantalum oxide film. Also, the deposition thickness and the "incubation time" of the tantalum oxide film vary according to the state of the underlayer during the deposition thereof. The term "incubation time" as used throughout the specification means the time period during which the deposition rate of the tantalum oxide reaches a steady-state after the deposition is initiated. The incubation time is also referred to as the seeding time.

Figure 1:
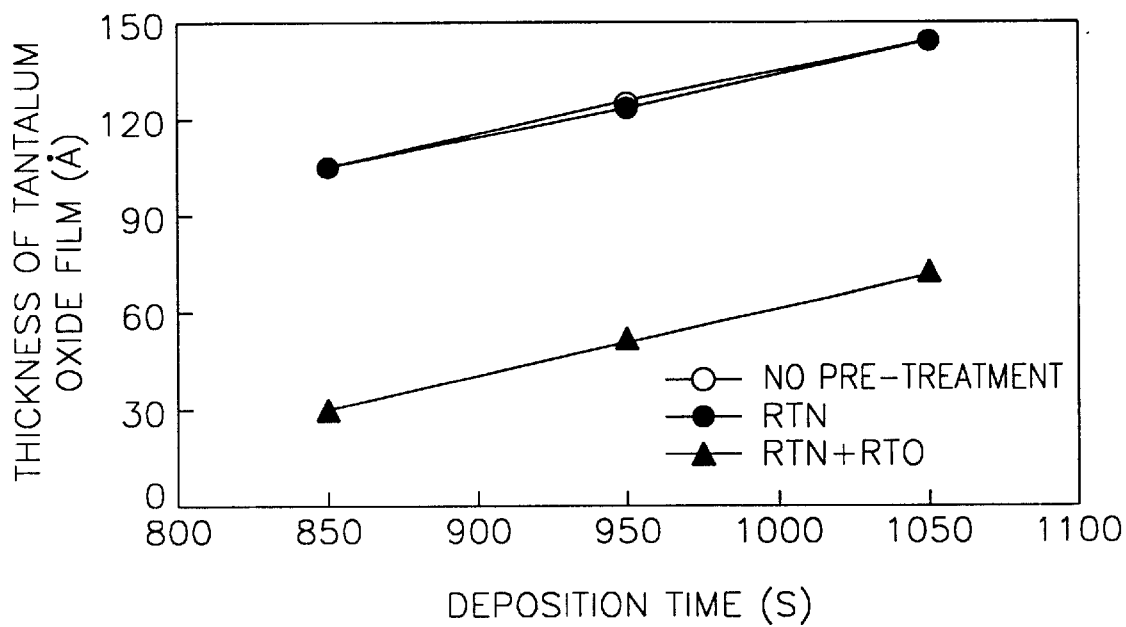
FIG. 1 is a graph showing the change in deposition thickness of a tantalum oxide/film according to a pre-treatment method of an underlayer.

FIG. 1 is a graph showing the change in thickness of the tantalum oxide film deposited on the underlayer depending on the surface state of the underlayer, which surface state changes with various pre-treatment methods.

In order to obtain the results depicted in FIG. 1, the change in thickness of the tantalum oxide film as a function of the deposition time was measured with respect to various pre-treatment cases including: (1) a case where no pre-treatment is performed with respect to a silicon wafer used as the underlayer (-○-); (2) a case in which a rapid thermal nitridation (RTN) treatment is performed with respect to the silicon wafer (-●-); and (3) a case in which a rapid thermal oxidation (RTO) treatment is performed with respect to the silicon wafer after performing the RTN treatment with respect to the silicon wafer (-▲-).

As shown in FIG. 1, the thickness of the tantalum oxide film deposited on the underlayer in the case of the RTN+RTO treatment is smaller, by about 60 Å, than those in the cases where no pre-treatment is performed, and where only an RTN treatment is performed.

From the above result, it can be seen that the thickness of the tantalum oxide film deposited on an underlayer formed of silicon oxide (Si—O) or silicon oxynitride (Si—O—N) is smaller than the thickness of the tantalum oxide film deposited on an underlayer formed of silicon (Si) or silicon nitride (Si—N). That is to say, the incubation time for depositing the tantalum oxide film is longer when the underlayer is formed of Si—O or Si—O—N than when the underlayer is formed of Si or Si—N.

The difference in the incubation time according to the component of the surface of the underlayer is due to the difference in the surface absorption mechanism of a Ta source gas during the deposition of the tantalum oxide film.

That is, the bond energy of the Si—O component is stronger than the bond energy of Si—Si or Si—N. Therefore, when Si—O is included in the components of the surface of the underlayer, the Ta source gas is not easily decomposed at an initial stage of the tantalum oxide film deposition process. Accordingly, the incubation time increases.

But, as depicted in FIG. 1, note that the above three pre-treatment cases have little effect on increasing the rate of the deposition thickness in accordance with the deposition time of the tantalum oxide film, i.e., the slope of the line. Therefore, the component of the surface of the underlayer resulting after the respective pre-treatment is performed affects the incubation time at an initial stage of the deposition process and does not greatly affect the deposition rate.

When the incubation time increases, the deposition time of the tantalum oxide film increases, and as a result the throughput of products deteriorates. Therefore, it is necessary to reduce the incubation time at an initial stage during the deposition of the tantalum oxide film in order to increase the throughput of products.

As described previously, in order to reduce the incubation time, the component of the surface of the underlayer should be changed from Si—O—N or Si—O to Si or Si—N.

The electrical characteristics of the capacitor according to the component of the surface of the underlayer are estimated as follows.

Figure 2A:
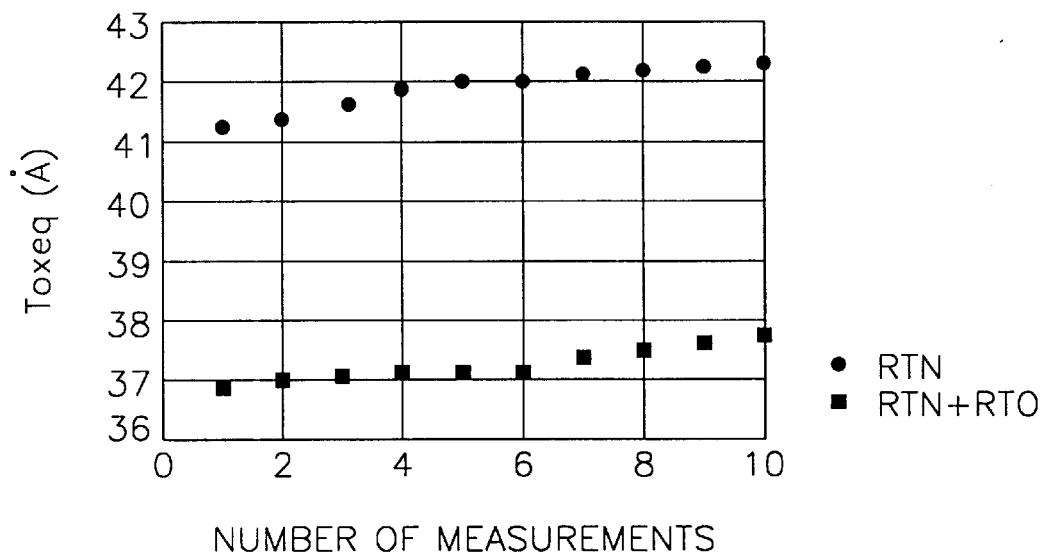
FIGS. 2A and 2B are graphs estimating the electrical characteristics of the effective oxide thickness and leakage current of a capacitor employing tantalum oxide films formed as dielectric films after performing different pre-treatments.
Figure 2B:
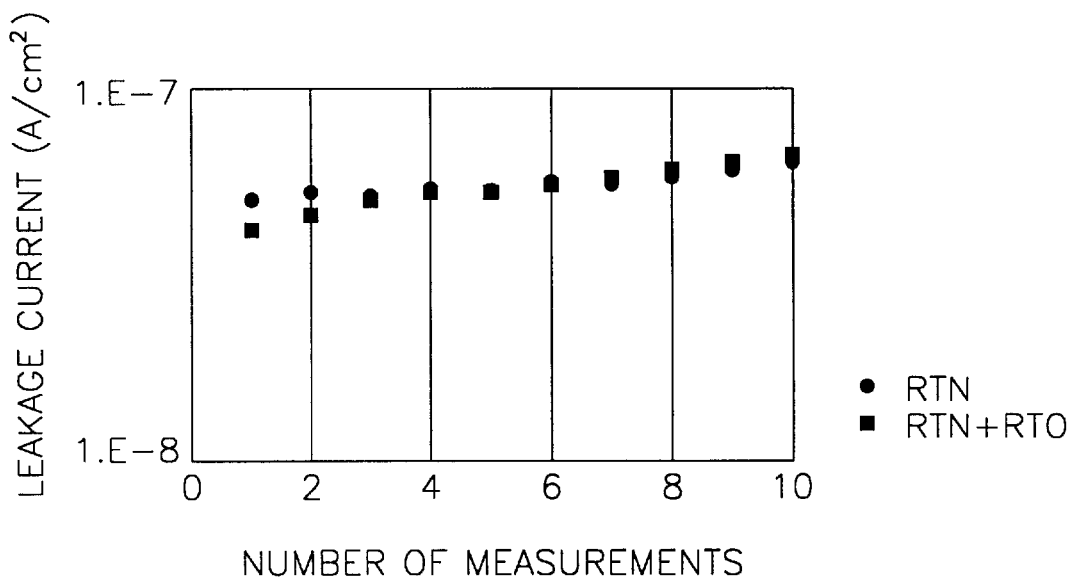

FIGS. 2A and 2B are graphs estimating the effective oxide thickness (Toxeq) and leakage current characteristics of a capacitor employing tantalum oxide films as dielectric films formed after performing different pre-treatments.

In order to obtain the results of FIGS. 2A and 2B, the effective oxide thickness (Toxeq) and the leakage current in the capacitor were measured with respect to the case (●) in which the underlayer formed of silicon is pre-processed by the RTN method, and the case (■) in which the underlayer formed of silicon is RTO processed after it is RTN processed.

As shown in FIGS. 2A and 2B, the leakage current characteristics of the respective cases are similar, however, the effective oxide thickness is improved by about 4–5 Å when the underlayer is both RTN and RTO processed compared to when the underlayer is RTN processed only. That is, the effective oxide thickness is improved when the Si—O component is formed in the surface of the underlayer by the both the RTN and RTO processes, compared to when the Si—N component is formed in the surface of the underlayer by the RTN process only.

The reason why the effective oxide thickness is improved when the Si—O component is included in the surface of the underlayer is that the characteristics of the tantalum oxide film and the underlayer are not deteriorated when exposed to an oxygen gas supplied after the deposition of the tantalum oxide film.

As can be seen from the above results, when the tantalum oxide film is formed on the underlayer film having a surface which includes the Si—O component, productivity deteriorates comparatively since the incubation time increases. However, it is more advantageous in respect to the electrical characteristics of the capacitor.

The present invention provides optimal processing conditions by which it is possible to minimize the incubation time without deteriorating the electrical characteristics of the capacitor during the tantalum oxide film deposition process.

As described previously, both the incubation time of the deposition process for forming a tantalum oxide film and the electrical characteristics of the capacitor having the tantalum oxide film, depend on the components of the surface of the underlayer on which the tantalum oxide film is formed. The incubation time can be changed by controlling deposition processing conditions for forming the tantalum oxide film, for example, the flow order and the flow rate of gases such as a Ta precursor, an oxygen source gas, and a carrier gas, which are required for the deposition process for forming the tantalum oxide film, and the pressure and the temperature in a reaction chamber.

The incubation time is reduced by exposing the underlayer on which the tantalum oxide film is to be deposited, i.e., the surface of the lower electrode, to a gas required for the tantalum oxide film deposition processing such as the Ta precursor, the oxygen source, and the carrier gas before depositing the tantalum oxide in the reaction chamber, so as to change the state of the surface of the lower electrode. Also, the electrical characteristics of the capacitor can be improved by covering the surface of the lower electrode with some oxygen by exposing the surface of the lower electrode to the oxygen atmosphere. Here, exposing the lower electrode to the process gas affects the surface of the lower electrode. Note that it does not affect the incubation time, but does affect the electrical characteristics of the capacitor by a small amount. This is because the changes in the electrical characteristics of the capacitor are determined by the reaction of the tantalum component in the tantalum oxide film with the silicon component in the underlayer during a follow-on thermal process performed under a high temperature.

Figure 3:
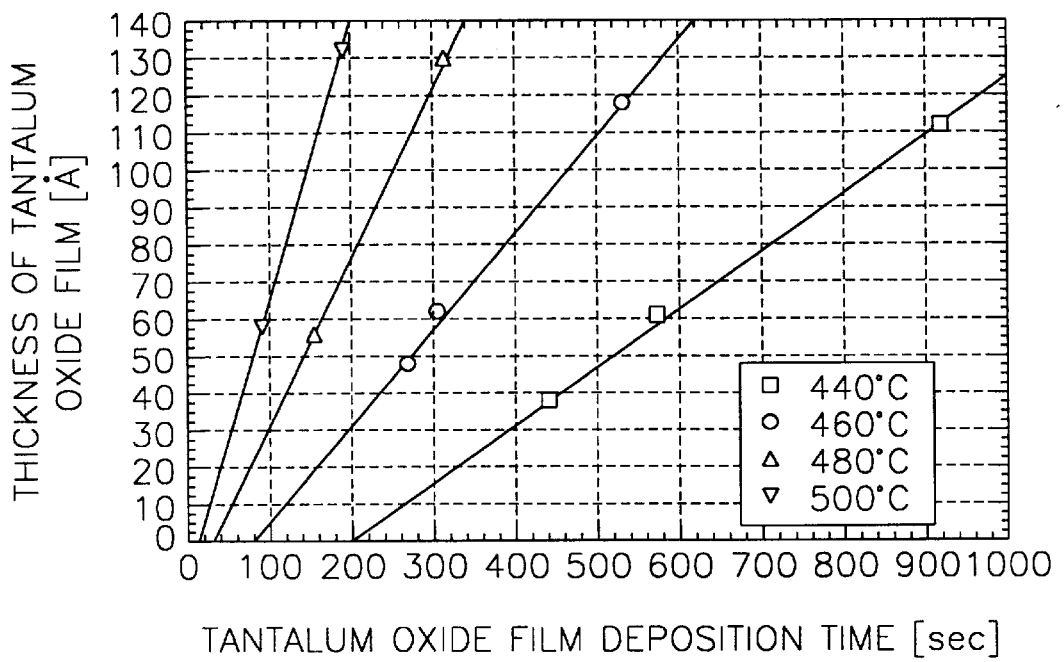
FIG. 3 is a graph showing the change in thicknesses of tantalum oxide films according to the change in deposition temperature during the formation of the tantalum oxide film.

It was discovered that the incubation time was reduced when the deposition temperature was increased during the deposition processing for forming the tantalum oxide film. FIG. 3 is a graph showing the change in incubation time according to the change in deposition temperature during the formation of the tantalum oxide film.

In order to obtain the result of FIG. 3, the tantalum oxide film was deposited at the deposition temperatures of 440° C., 460° C., 480° C., and 500° C. in a state in which the surface of the underlayer was pre-treated by the RTN method so that the Si—N component is included in the surface of the underlayer before the formation of the tantalum oxide film.

As shown in FIG. 3, when the deposition temperature was 440° C., the incubation time was 200 seconds, and when the deposition temperature was 500° C., the incubation time was about 10 seconds. The difference in the incubation times is therefore about 190 seconds.

It is believed the reason why the incubation time is reduced as the deposition temperature increases is because the deposition mechanism varies according to the difference in the deposition temperatures. That is, in the low temperature deposition, the deposition mechanism corresponds to a reaction limited region, in which sufficient amounts of reactants are supplied in a vapor phase and the reaction rate on the surface of the wafer is a main factor which determines the overall reaction rate. In the high temperature deposition, the deposition mechanism corresponds to a diffusion limited region, in which the reaction rate on the surface of the wafer is much faster than the diffusion speed of the reactants, and the overall reaction rate depends on the diffusion speed of the reactants.

Therefore, since the reaction rate on the surface of the underlayer is greater than the diffusion speed during the high temperature deposition, the reactants of the tantalum precursor are decomposed and adsorbed onto the surface of the underlayer in the initial stage of the deposition. Accordingly, the incubation time is reduced. As a result, when the deposition temperature increases, the incubation time in the initial stage of the deposition is reduced.

The same result as the above can be observed when the surface of the underlayer on which the tantalum oxide film is to be formed includes a Si—O or Si—O—N component. Therefore, it is possible to control the incubation time by changing the deposition temperature of the tantalum oxide film.

Figure 4:
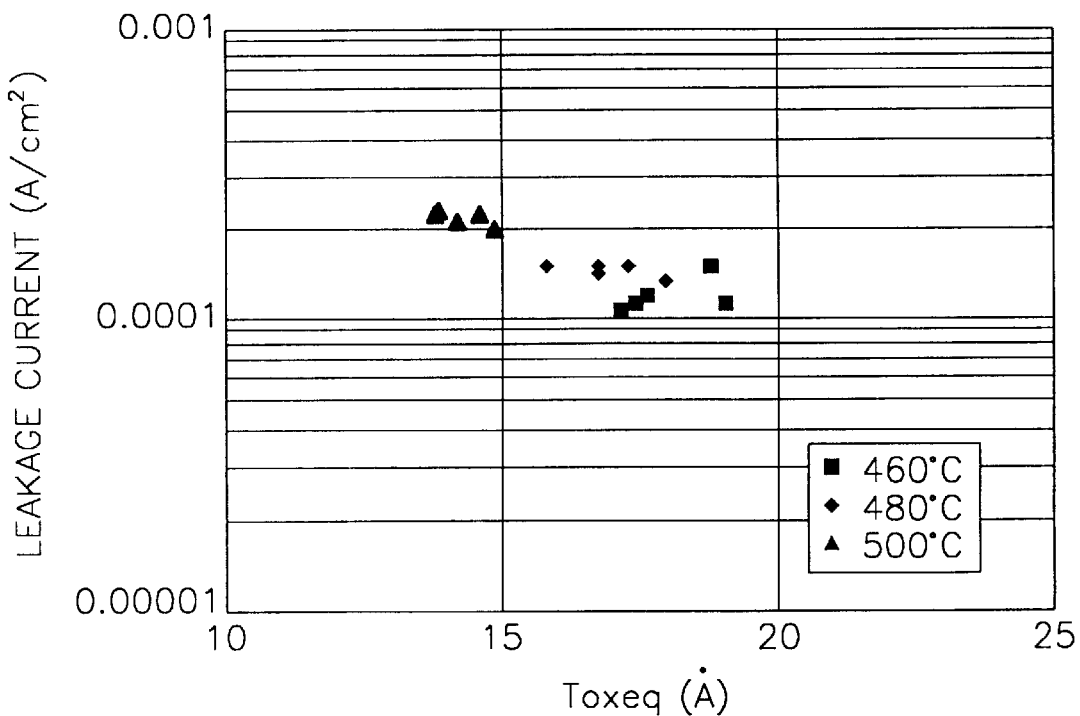
FIG. 4 is a graph showing leakage current characteristics according to the deposition temperature for forming the tantalum oxide film.

FIG. 4 is a graph for estimating electrical characteristics of a capacitor according to a change in the deposition temperature during the formation of the tantalum oxide film. FIG. 4 shows the effective oxide thickness (Toxeqi) and the leakage current at an applied voltage of 3.0V for the tantalum oxide films formed with the deposition temperatures 460° C., 480° C., and 500° C., respectively.

According to FIG. 4, the effective oxide thickness is in a range of 13 to 19 Å and the leakage current is in a range of 0.1 to 0.3 mA/cm$^2$. The electrical characteristics of the capacitor are similar in each case. Namely, when the effective oxide thickness is reduced, the leakage current increases. Also, when the effective oxide thickness increases, the leakage current is reduced. FIG. 4 shows that the change in the leakage current and the effective oxide thickness according to a change in the deposition temperature of the tantalum oxide film is negligible.

An experiment was performed to estimate the degree of defects in the tantalum oxide film according to the deposition temperature during the formation of the tantalum oxide film.

After preparing samples obtained by forming the tantalum oxide film on a polysilicon film at the deposition temperatures of 460° C., 480° C., and 500° C., the samples were dipped into an etching solution selectively reacting with polysilicon for a certain time. Then, the samples were taken out of the etching solution and void defects in the polysilicon film were observed by a scanning electron microscope (SEM).

In the dipping stage, the etching solution penetrates into the polysilicon film through vulnerable areas of the tantalum oxide film and dissolves the polysilicon under the tantalum oxide film. Accordingly, void defects are formed.

As observed by the SEM, the density of the void defects when the deposition temperature was 460° C. was similar to that when the deposition temperature was 480° C. Also, when the deposition temperature was 500° C., the density of the void defects increased rapidly. Even though the vulnerable areas do not affect the electrical characteristics such as the effective oxide thickness and the leakage current, they deteriorate the reliability.

Based on the above experiments, there is described below a method for forming a tantalum oxide film used as the capacitor dielectric film. The deposition method improves the electric characteristics of the tantalum oxide film, lowers the defect density, and reduces the incubation time.

FIGS. 5A through 5F are sectional views for describing a method for manufacturing a capacitor according to a preferred embodiment of the present invention.

Figure 5A:
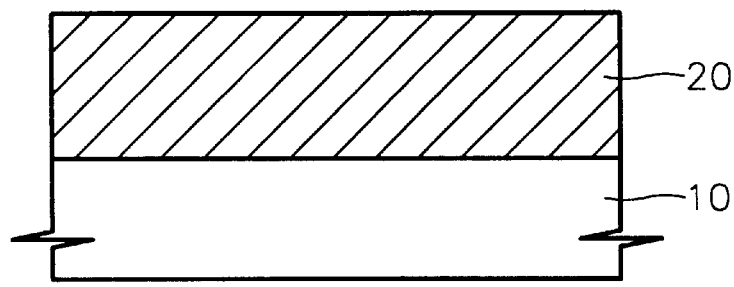
FIGS. 5A through 5F are sectional views for describing a sequential method for manufacturing a capacitor according to a preferred embodiment of the present invention.

Referring to FIG. 5A, a lower electrode 20 formed of polysilicon is formed on a semiconductor substrate 10 such that it is electrically connected to the active area of the semiconductor substrate 10. The lower electrode 20 may also be formed of a conductive material film such as a metal film, a metal oxide film, a metal nitride film, or a metal oxynitride film.

Figure 5B:
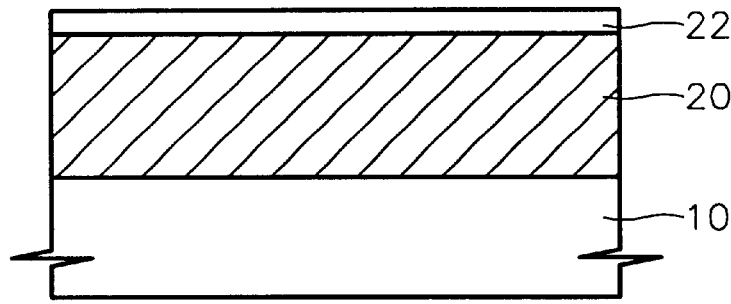

Referring to FIG. 5B, a pre-treatment film 22, including a component composed of $SiN_x$, $SiO_x$, $SiO_xN_y$, or a mixture thereof, is formed on the surface of the lower electrode 20 by pre-treating the surface of the lower electrode 20. The pre-treatment film 22 is formed on the surface of the lower electrode 20 to prevent formation of $SiO_2$ caused by a reaction between the silicon component of the lower electrode 20 and the tantalum oxide of the dielectric film formed in the following process.

In order to form the pre-treatment film 22, an RTN method, an RTO method, a CVD method, or a combined method thereof can be used.

When the pre-treatment film 22 is formed by the RTN method, the pre-treatment process is performed in a $NH_3$ atmosphere at 500 to 900° C. When the pre-treatment film 22 is formed by the RTO method, the pre-treatment process is performed in an $O_2$ atmosphere, a $N_2O$ atmosphere, or an atmosphere created by the gas mixture of $O_2$ and $N_2O$.

In order to reduce the activation energy of a reaction gas used during the pre-treatment process for forming the pre-treatment film 22, a process of supplying a reaction gas in a plasma state, or a process of supplying a plasma comprised of $N_2$ or $O_2$ with the reaction gas, may be performed. It is also possible to reduce the activation energy of the reaction gas by irradiating ultraviolet (UV) radiation instead of using plasma.

Figure 5C:
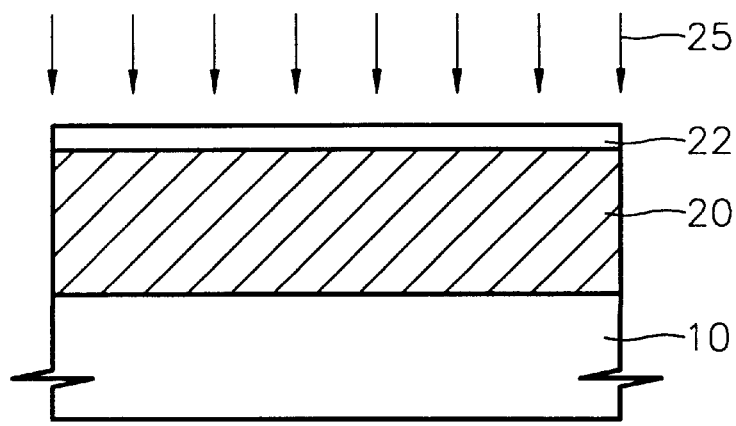

Referring to FIG. 5C, a flow of a tantalum (Ta) precursor 25 is supplied onto the lower electrode 20 on which the pre-treatment film 22 is formed so as to induce a state in which tantalum reacts faster than the oxygen atoms on the surface of the part on which the dielectric film is to be formed. As a result, the lower electrode 20 covered with the pre-treatment film 22 is covered with the tantalum component prior to the deposition of a dielectric film. Accordingly, it is possible to reduce the incubation time without affecting the electrical characteristics of the capacitor.

A metal alkoxide such as $Ta(OC_2H_5)_5$, an organic metal such as a betadiketonate, a metal halide such as $TaCl_5$, or a combination thereof, can be used as the Ta precursor 25.

Figure 5D:
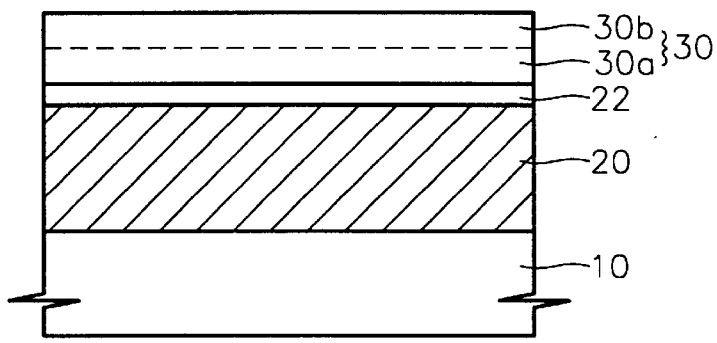

FIG. 5D shows the steps of forming a dielectric film 30 formed of the tantalum oxide film on the resulting structure of FIG. 5C. More specifically, the dielectric film 30 is formed in two steps on the lower electrode 20 covered with the pre-treatment film 22. In a first step, a first dielectric layer 30a is formed by the CVD method at a first temperature T1 selected in a range of 350 to 550° C. A second step includes continuously forming a second dielectric layer 30b on the first dielectric layer 30a by the CVD method at a second temperature T2 selected in a range of 350 to 550° C., wherein the temperature T2 is different from the first temperature T1. Preferably, the second temperature T2 is lower than the first temperature T1, although it need not be.

Alternatively, after forming the first dielectric layer 30a, the first dielectric layer 30a can be thermally processed in an oxygen atmosphere before forming the second dielectric layer 30b.

It is possible to reduce the incubation time and to prevent the electrical characteristics from deteriorating during the formation of the dielectric film 30 by changing the processing temperature during the formation of the dielectric film 30. In addition, a step of supplying plasma or irradiating UV radiation may be included during the formation of the dielectric film 30. Moreover, a single wafer type or a batch type reactor can be used during the formation of the dielectric film 30.

The process of forming the dielectric film 30 is performed by gasifying the Ta precursor selected from the a group consisting of a metal alkoxide such as $Ta(OC_2H_5)_5$, an organic metal such as a beta-diketonate, a metal halide such as $TaCl_5$, or a combination thereof. The Ta precursor 25 is then reacted with oxygen using a carrier gas. At this time, the processing pressure is maintained within a range between 100mTorr and atmospheric pressure, and an inert gas is used as an atmosphere gas.

As described above by way of example, the second dielectric layer 30b was formed at the second temperature T2, which is relatively low, after forming the first dielectric layer 30a at the first temperature T1, which is relatively high, in order to form the dielectric film 30. However, one of skill in the art would appreciate that the present invention is not restricted to a situation where T2<T1, rather the present invention may be performed where T1>T2. In other words, an important characteristic of the method for forming the dielectric film 30 according to the present invention is that the deposition temperature is changed during the two steps for forming the dielectric film 30.

Figure 5E:
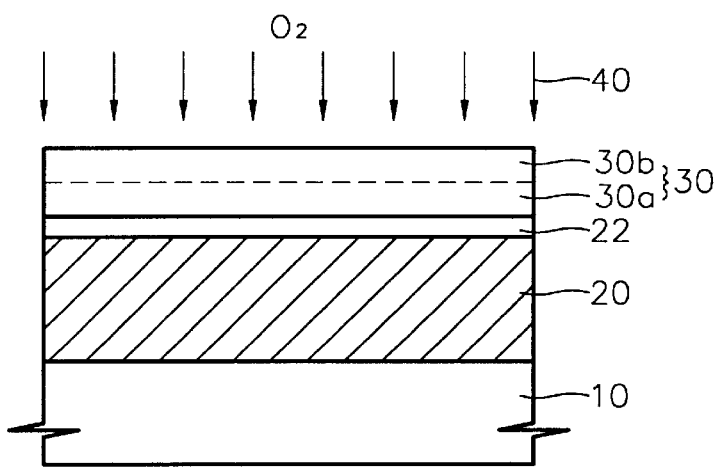

Referring to FIG. 5E, the dielectric film 30 is thermally processed in an oxygen atmosphere at about 650 to 800° C. The thermal treatment is performed in an oxygen containing gas 40, for example, in a gas atmosphere including $O_2$, $O_3$, or $N_2O$. As a result, it is possible to supply oxygen which is lacking in the dielectric film 30 to thereby decrease the areas that are vulnerable to the leakage current by densifying the structure of the tantalum oxide film.

At this time, a process of supplying the oxygen containing gas 40 in a plasma state, or a process of simultaneously supplying plasma of $N_2$ or $O_2$ may be performed in order to lower the activation energy of a reaction gas being used. Also, it is possible to lower the activation energy of the reaction gas by irradiating UV radiation instead of using the plasma.

Figure 5F:
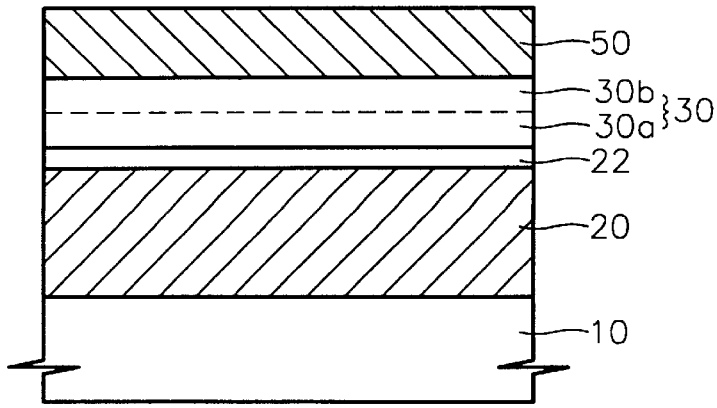

Referring to FIG. 5F, the capacitor is completed by forming an upper electrode 50 on the dielectric film 30. The upper electrode 50 is formed of a conductive material film such as a polysilicon film, a metal film, a metal oxide film, a metal nitride film, or a metal oxynitride film.

According to the present invention, the capacitor dielectric film is formed by changing the process conditions for depositing the tantalum oxide film, using a two step deposition process, with each step being performed at a different temperature within a designated temperature range. As a result, it is possible to form a tantalum oxide film having a reduced defect density. When such a tantalum oxide film is used as a dielectric film, it is possible to improve the electrical characteristics of the capacitor and to reduce the incubation time during the deposition processing for forming the tantalum oxide film.

Also, it is possible to effectively reduce the incubation time without deteriorating the electrical characteristics of the capacitor since the dielectric film is formed on the surface of the lower electrode which is previously pre-treated by the Ta precursor.

The present invention is not restricted to the above embodiments, and it is clearly understood that many variations are possible within the scope and spirit of the present invention by anyone skilled in the art.

What is claimed is:

1. A method for manufacturing a capacitor of a semiconductor memory device, comprising:
 (a) forming a lower electrode electrically connected to an active region of a semiconductor substrate;
 (b) forming a pre-treatment film on the surface of the lower electrode, the pre-treatment film including a component selected from a group consisting of silicon oxide, silicon nitride, and combinations thereof;

(c) forming a dielectric film on the pre-treatment film using a tantalum (Ta) precursor, comprising depositing a first dielectric layer on the pre-treatment film at a first temperature selected from a designated temperature range, and depositing a second dielectric layer on the first dielectric layer at a second temperature different from the first temperature and selected from the designated temperature range; and (d) performing a thermal treatment on the dielectric film in an oxygen atmosphere.

2. The method of claim 1, wherein, in the step (a), the lower electrode is formed of one selected from a group consisting of a polysilicon film, a metal film, a metal oxide film, a metal nitride film, a metal oxynitride film and combinations thereof.

3. The method of claim 1, wherein, in the step (b), the pre-treatment film is formed by one of a group consisting of a rapid thermal nitridation (RTN) method, a rapid thermal oxidation (RTO) method, a chemical vapor deposition (CVD) method, and combinations thereof.

4. The method of claim 3, wherein, in the step (b), further comprising a step of supplying plasma while forming the pre-treatment film.

5. The method of claim 3, wherein, in the step (b), further comprising a step of irradiating with ultra violet (UV) radiation while forming the pre-treatment film.

6. The method of claim 1, wherein, in the step (c), the designated temperature range is 350 to 550° C.

7. The method of claim 1, wherein, in the step (c), the second temperature is lower than the first temperature.

8. The method of claim 1, wherein, in the step (c), the second temperature is higher than the first temperature.

9. The method of claim 1, wherein, in the step (c), the forming of the dielectric film is performed at a pressure of between 100 mTorr and atmospheric pressure.

10. The method of claim 1, wherein in the step (c), the Ta precursor is one selected from a group consisting of metal alkoxides, organic metals, metal halides, and mixtures thereof.

11. The method of claim 1, wherein, in the step (c), further comprising a step of supplying plasma while forming the dielectric film.

12. The method of claim 1, wherein, in the step (c), further comprising a step of irradiating with ultra violet (UV) radiation while forming the dielectric film.

13. The method of claim 1, wherein, in the step (c), the forming of the dielectric film is performed in a single wafer type reactor.

14. The method of claim 1, wherein, in the step (c), the forming of the dielectric film is performed in a batch type reactor.

15. The method of claim 1, wherein, in the step (d), the thermal treatment is performed at 650 to 800° C.

16. The method of claim 1, wherein, in the step (d), the thermal treatment is performed in a gas atmosphere selected from a group consisting of $O_2$, $O_3$, $N_2O$ and mixtures thereof.

17. The method of claim 1, wherein, in the step (d), further comprising a step of supplying plasma while performing the thermal treatment.

18. The method of claim 1, wherein, in the step (d), further comprising a step of irradiating with ultra violet (UV) radiation while performing the thermal treatment.

19. The method of claim 1, after the step (b) and before the step (c), further comprising a step of flowing the Ta precursor over the lower electrode covered with the pre-treatment film.

20. The method of claim 17, wherein the Ta precursor is one selected from a group consisting of metal alkoxides, organic metals, metal halides, and combinations thereof.

21. The method of claim 1, wherein, in the step (c), further comprising performing a thermal treatment on the first dielectric layer in an oxygen atmosphere after forming the first dielectric layer and before forming the second dielectric layer.

* * * * *